US010446472B2

(12) United States Patent
Chu et al.

(10) Patent No.: US 10,446,472 B2
(45) Date of Patent: Oct. 15, 2019

(54) NITRIDE SEMICONDUCTOR DEVICE

(71) Applicant: Nuvoton Technology Corporation, Hsinchu (TW)

(72) Inventors: Kuei-Yi Chu, Hsinchu (TW); Heng-Kuang Lin, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 16/039,347

(22) Filed: Jul. 19, 2018

(65) Prior Publication Data

US 2019/0027426 A1 Jan. 24, 2019

(30) Foreign Application Priority Data

Jul. 20, 2017 (TW) .............................. 106124333 A

(51) Int. Cl.
| | | |
|---|---|---|
| *H01L 29/76* | (2006.01) | |
| *H01L 23/48* | (2006.01) | |
| *H01L 29/207* | (2006.01) | |
| *H01L 29/872* | (2006.01) | |
| *H01L 23/535* | (2006.01) | |
| *H01L 29/778* | (2006.01) | |

(Continued)

(52) U.S. Cl.
CPC .......... *H01L 23/481* (2013.01); *H01L 23/535* (2013.01); *H01L 29/0615* (2013.01); *H01L 29/0653* (2013.01); *H01L 29/0657* (2013.01); *H01L 29/205* (2013.01); *H01L 29/207* (2013.01); *H01L 29/4175* (2013.01); *H01L 29/7786* (2013.01); *H01L 29/7787* (2013.01); *H01L 29/872* (2013.01); *H01L 29/0649* (2013.01); *H01L 29/2003* (2013.01)

(58) Field of Classification Search
CPC . H01L 23/481; H01L 23/535; H01L 29/0615; H01L 29/0649; H01L 29/0657; H01L 29/2003; H01L 29/207; H01L 29/4175; H01L 29/7787; H01L 29/872
USPC ....................................................... 257/213
See application file for complete search history.

(56) References Cited

U.S. PATENT DOCUMENTS

| | | |
|---|---|---|
| 2012/0211800 A1 | 8/2012 | Boutros |
| 2014/0159118 A1 | 6/2014 | Lenci et al. |

(Continued)

FOREIGN PATENT DOCUMENTS

| | | |
|---|---|---|
| CN | 203941904 | 11/2014 |
| TW | 201138107 | 11/2011 |

OTHER PUBLICATIONS

Domenica Visalli, "Optimization of GaN-on-Si HEMTs for High Voltage Applications", Katholieke Universiteit Leuven, Groep Wetenschap & Technologie, Dec. 2011, pp. 1-184.

*Primary Examiner* — Tu-Tu V Ho
(74) *Attorney, Agent, or Firm* — JCIPRNET

(57) ABSTRACT

Provided is a nitride semiconductor device including a substrate, a nucleation layer, a buffer layer, a channel layer, a first electrode, and a second electrode. The substrate has a first surface and a second surface opposite to the first surface. The nucleation layer, the buffer layer, the channel layer, and the barrier layer are sequentially disposed on the first surface of the substrate. The first electrode layer and the second electrode layer are disposed on the barrier layer. A first void penetrates through the substrate, the nucleation layer, the buffer layer, the channel layer, and the barrier layer and exposes a portion of the first electrode.

18 Claims, 8 Drawing Sheets

(51) Int. Cl.
    *H01L 29/417*     (2006.01)
    *H01L 29/06*     (2006.01)
    *H01L 29/205*     (2006.01)
    *H01L 29/20*     (2006.01)

(56) References Cited

U.S. PATENT DOCUMENTS

| | | |
|---|---|---|
| 2015/0076593 A1 | 3/2015 | Darwish et al. |
| 2015/0364591 A1* | 12/2015 | Lu .................... H01L 29/66462 |
| | | 257/194 |
| 2016/0118379 A1* | 4/2016 | Padmanabhan ..... H01L 27/0629 |
| | | 257/192 |
| 2018/0337093 A1* | 11/2018 | Chang ................ H01L 29/4175 |

\* cited by examiner

NITRIDE SEMICONDUCTOR DEVICE

CROSS-REFERENCE TO RELATED APPLICATION

This application claims the priority benefit of Taiwan application serial no. 106124333, filed on Jul. 20, 2017. The entirety of the above-mentioned patent application is hereby incorporated by reference herein and made a part of this specification.

BACKGROUND OF THE INVENTION

Field of the Invention

The invention relates to a semiconductor device, and particularly to a nitride semiconductor device.

Description of Related Art

To make power devices have higher power densities, higher operation frequencies, and less power loss, a wide band gap GaN semiconductor device becomes the most popular choice currently in the limelight. However, as an epitaxial layer grows on a silicon substrate, there may be an excessive number of defects on the epitaxial layer due to the mismatch of crystal lattices and thermal expansion coefficients, resulting in a significant decrease in breakdown voltage of the power device. Additionally, under different conditions of bias voltage and impulse, internal defects may trap or release electrons and lead to changing of on-resistance of the device with the bias voltage condition. As a consequence, current collapse may occur.

SUMMARY OF THE INVENTION

Accordingly, the invention provides a nitride semiconductor device, in which a substrate and a drain (or anode) are equipotential so as to increase a breakdown voltage and reduce current collapse.

An embodiment of the invention provides a nitride semiconductor device including a substrate, a nucleation layer, a buffer layer, a channel layer, and a barrier layer, a first electrode, and a second electrode. The substrate has a first surface and a second surface opposite to the first surface. The nucleation layer, the buffer layer, the channel layer, and the barrier layer are sequentially disposed on the first surface of the substrate. The first electrode and the second electrode are disposed on the barrier layer. A first void penetrates through the substrate, the nucleation layer, the buffer layer, the channel layer, and the barrier layer and exposes a portion of the first electrode.

In an embodiment of the invention, the nitride semiconductor device further includes a metal layer disposed on the second surface of the substrate and a surface of the first void.

In an embodiment of the invention, the substrate and the first electrode are electrically connected to each other and are equipotential.

In an embodiment of the invention, a second void penetrates through the substrate and the nucleation layer and extends into the buffer layer. The second void is connected to the first void. The metal layer is further disposed on a surface of the second void.

In an embodiment of the invention, the nitride semiconductor device further includes an insulation doped region located between the substrate and the channel layer.

In an embodiment of the invention, an edge of the second void exceeds an edge of the first electrode.

In an embodiment of the invention, at least one third void penetrates through the substrate and at least extends into the nucleation layer. The at least one third void is separated from the second void. The metal layer is further disposed on a surface of the at least one third void.

In an embodiment of the invention, the nitride semiconductor device further includes an insulation doped region located between the substrate and the channel layer.

In an embodiment of the invention, when measuring from the second surface of the substrate, the at least one third void and the second void have the same depth.

In an embodiment of the invention, when measuring from the second surface of the substrate, the at least one third void and the second void have different depths.

In an embodiment of the invention, the at least one third void includes a plurality of third voids having the same size.

In an embodiment of the invention, the at least one third void includes a plurality of third voids having respectively different sizes.

In an embodiment of the invention, size refers to width, depth, or both.

In an embodiment of the invention, a thickness ratio of the substrate to the nucleation layer falls in a range from about 50:1 to 100:1.

In an embodiment of the invention, the nitride semiconductor device further includes an insulation doped region located between the substrate and the channel layer.

In an embodiment of the invention, the insulation doped region is located within the nucleation layer.

In an embodiment of the invention, a dopant in the insulation doped region includes argon, nitride, or a combination thereof.

In an embodiment of the invention, a thickness ratio of the substrate to the nucleation layer falls in a range from about 3:1 to 10:1.

In an embodiment of the invention, the nitride semiconductor device further includes a dielectric layer disposed between the metal layer and each of the substrate, the nucleation layer, the buffer layer, the channel layer, and the barrier layer.

In an embodiment of the invention, the nitride semiconductor device further includes a third electrode disposed on the barrier layer and between the first electrode and the second electrode.

In an embodiment of the invention, the first electrode is a drain, the second electrode is a source, and the third electrode is a gate.

In an embodiment of the invention, the first electrode is an anode and the second electrode is a cathode.

Based on the above, according to the embodiments of the invention, a back substrate structure including at least one void (e.g., a first void and an optional second void) and a metal layer is introduced to a nitride semiconductor device, so as to increase the breakdown voltage and reduce current collapse. More specifically, at least one void is disposed in the back surface of the substrate and the metal layer is disposed on the surface of the void, so as to electrically connect the substrate and the drain (or the anode). With such configuration, a low electric field may be formed between the device surface and the substrate to significantly reduce the chance of electrons being captured by defects internally and consequently reduce current collapse. Moreover, a dielectric layer disposed between the metal layer and each of the substrate, the nucleation layer, the buffer layer, the channel layer and the barrier layer is capable of blocking a current leakage path and increasing the breakdown voltage. Additionally, the design of the insulation doped area is capable of further blocking the current leakage path. One or more third voids disposed in the back surface of the substrate are capable of further increasing the heat conduction ability of the substrate and lowering the operation temperature of the device.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
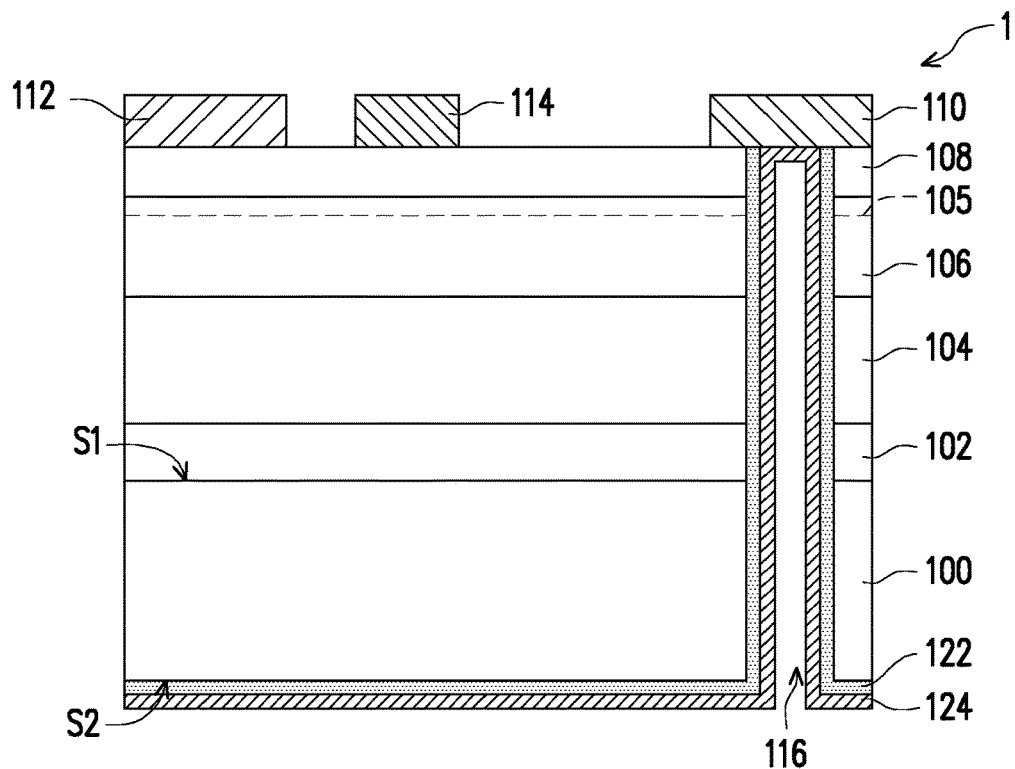
FIG. 1 to FIG. 8 are schematic cross-sectional views of a variety of nitride semiconductor devices according to some embodiments of the invention.

In the invention, a back substrate structure including a metal layer and at least one void is introduced to a nitride semiconductor device, so as to reduce the high electric field between the device surface and the substrate, and thereby increase the breakdown voltage and reduce current collapse.

FIG. 1 to FIG. 8 are schematic cross-sectional views of a variety of nitride semiconductor devices depicted in some embodiments of the invention. The nitride semiconductor devices in FIG. 1 to FIG. 8 are similar to one another but are not entirely the same in the designs of the back substrate structure. Detailed descriptions are as follows.

Referring to FIG. 1 to FIG. 4, nitride semiconductor devices 1, 2, 3, and 4 of the invention each include a substrate 100, a nucleation layer 102, a buffer layer 104, a channel layer 106, a barrier layer 108, a first electrode 110, a second electrode 112, and a third electrode 114.

The substrate 100 has a first surface S1 and a second surface S2. The second surface S2 is opposite to the first surface S1. In an embodiment of the invention, the first surface S1 is a front surface, while the second surface S2 is a back surface. In an embodiment of the invention, the substrate 100 includes sapphire, Si, SiC, or GaN.

The channel layer 106 is disposed on the first surface S1 of the substrate 100. In an embodiment of the invention, the channel layer 106 includes a Group III nitride, such as a Group III-V compound semiconductor material. In an embodiment, the channel layer 106 includes GaN. The channel layer 106 may be a doped or undoped layer. The channel layer 106 has a two-dimensional electron gas (2 DEG) 105 located below the interface between the channel layer 106 and the overlying barrier layer 108.

The nucleation layer 102 and the buffer layer 104 may be disposed between the substrate 100 and the channel layer 106 to reduce a difference in lattice constant and a difference in thermal expansion coefficient between the substrate 100 and the channel layer 106. More specifically, the nucleation layer 102 contacts the first surface S1 of the substrate 100, and the buffer layer 104 is disposed between the nucleation layer 102 and the channel layer 106. In an embodiment of the invention, the nucleation layer 102 includes a Group III nitride such as a Group III-V compound semiconductor material. In an embodiment, the nucleation layer 102 includes AlN, GaN, AlGaN, or a combination thereof. In an embodiment of the invention, the buffer layer 104 includes a Group III nitride, such as a Group III-V compound semiconductor material, and may have a single-layered or multi-layered structure. In an embodiment of the invention, the buffer layer 104 includes AlN, GaN, AlGaN, InGaN, AlInN, AlGaInN, or a combination thereof.

The barrier layer 108 is disposed on the channel layer 106. In an embodiment of the invention, the barrier layer 108 includes a Group III nitride, such as a Group III-V compound semiconductor material, and may have a single-layered or multi-layered structure. In an embodiment of the invention, the barrier layer 108 includes AlGaN, AlInN, AlN, AlGaInN, or a combination thereof. The barrier layer 108 may be a doped or undoped layer.

The first electrode 110 and the second electrode 112 are disposed on the barrier layer 108. However, the invention is not limited thereto. In an embodiment of the invention, at least one of the first electrode 110 and the second electrode 112 may extend into the channel layer 106 and may be electrically connected to the two-dimensional electron gas 105. In an embodiment of the invention, the first electrode 110 is a drain and the second electrode is a source. In addition, the first electrode 110 and the second electrode 112 include metal (e.g., Al, Ti, Ni, Au, or an alloy thereof) or another material able to form an Ohmic contact with a Group III-V compound semiconductor.

The third electrode 114 is disposed on the barrier layer 108 and is located between the first electrode 110 and the second electrode 112. In an embodiment of the invention, the third electrode 114 is a gate and the third electrode 114 includes metal or a metal nitride (e.g., Ta, TaN, Ti, TiN, W, Pd, Ni, Au, Al, or a combination thereof), a metal silicide (e.g., $WSi_x$), or another material able to form a Schottky contact with a Group III-V compound semiconductor. In an embodiment of the invention, the distance between the third electrode 114 and the first electrode 110 is not equal to (e.g., greater than) the distance between the third electrode 114 and the second electrode 112. In another embodiment of the invention, the distance between the third electrode 114 and the first electrode 110 is substantially equal to the distance between the third electrode 114 and the second electrode 112.

It is noted that, the nitride semiconductor device of the invention further has a back substrate structure that includes a void and a metal layer and is capable of electrically connecting the substrate to a high-voltage terminal (e.g., a drain or an anode), so as to reduce the high electric field between the device surface and the substrate, and thereby increase the breakdown voltage and reduce current collapse.

In an embodiment of the invention, as shown in FIG. 1, a back substrate structure of the nitride semiconductor device 1 includes a first void 116, a dielectric layer 122, and a metal layer 124. The first void 116 penetrates through the substrate 100, the nucleation layer 102, the buffer layer 104, the channel layer 106, and the barrier layer 108 from the second surface S2 of the substrate 100 and exposes a portion of the first electrode 110. The metal layer 124 is disposed on the second surface S2 of the substrate 100 and the surface of the first void 116. More specifically, the metal layer 124 is disposed on the sidewall and the bottom surface of the first void 116 and contacts the first electrode 110. With the metal layer 124, the substrate 100 is electrically connected to the first electrode 110, the substrate 100 and the first electrode 110 are equipotential, and the heat dissipation ability of the substrate 100 is increased. Additionally, an electrical connection structure between the substrate 100 and the first electrode 110 is not limited to the metal layer 124, and the substrate 100 and the first electrode 110 may be electrically connected to each other through another structure. In an embodiment of the invention, the metal layer 124 includes Ta, Ti, W, Pd, Ni, Au, Al, or a combination thereof. Moreover, the dielectric layer 122 is disposed between the metal layer 124 and each of the substrate 100, the nucleation layer 102, the buffer layer 104, the channel layer 106, and the barrier layer 108. With the dielectric layer 122, current leakage may be suppressed and the breakdown voltage may be increased. In an embodiment, the dielectric layer 122 includes silicon oxide, silicon nitride, silicon oxynitride, or a combination thereof.

Figure 2:
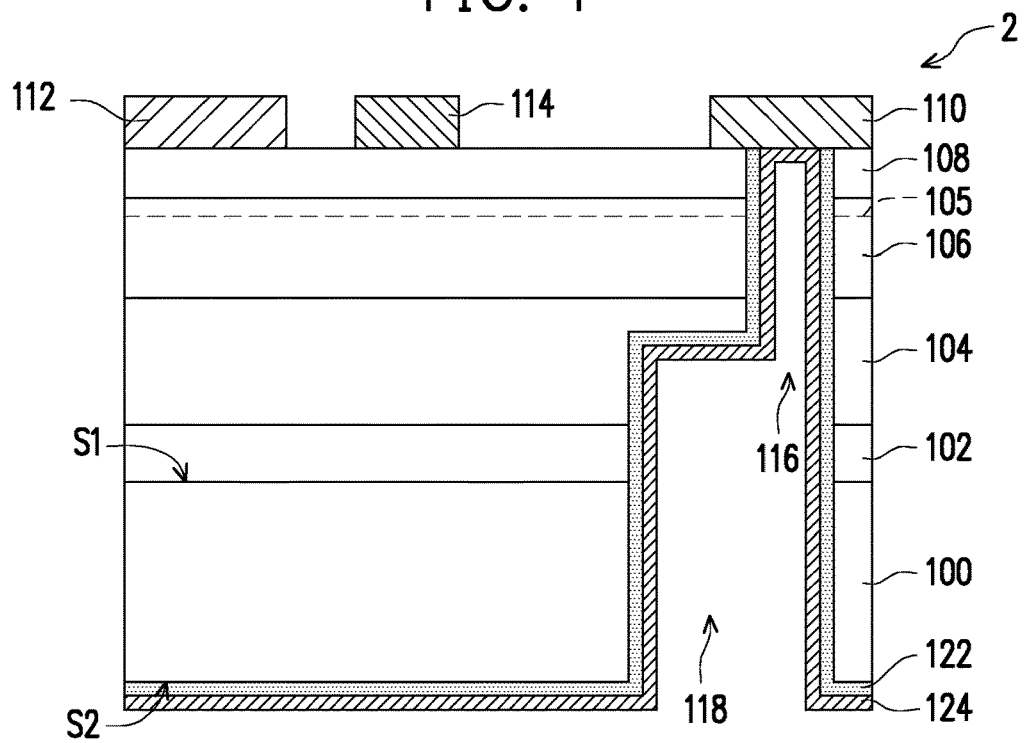

The nitride semiconductor device 2 in FIG. 2 is similar to the nitride semiconductor device 1 in FIG. 1, and the difference between them lies in that, the back substrate structure of the nitride semiconductor device 2 further includes a second void 118. The second void 118 penetrates through the substrate 100 and the nucleation layer 102 from the second surface S2 of the substrate 100 and extends into the buffer layer 104. The second void 118 is connected to the first void 116. More specifically, the first void 116 and the second void 118 are combined to form a void with unsymmetrical sidewalls, wherein one of the sidewalls is a substantively vertical sidewall and the other is a stepped sidewall. The stepped sidewall may be a single-stepped sidewall as shown in FIG. 2 or a multi-stepped sidewall.

In an embodiment of the invention, the edge of the second void 118 exceeds or is aligned to the edge of the first electrode 110, preferably exceeding the edge of the first electrode 110, so as to block a current leakage path. The effect of blocking a current leakage path is desirable when the second void 118 is used in combination with the dielectric layer 122. Moreover, the second void 118 may reduce the defect trapping effect in a region of the buffer layer 104 located between the first electrode 110 (e.g., a drain) and the third electrode 114 (e.g., a gate) and a neighboring region. When the bottom of the second void 118 is substantially as high as or higher than the interface between the substrate 100 and the nucleation layer 102 and below the two-dimensional electron gas 105 in the channel layer 106, the defect trapping effect may be reduced. In another embodiment of the invention, the second void 118 may be widened according to designing requirements, such that the edge of the second void 118 is located below the third electrode 114 or even below the second electrode 112. Additionally, when measuring from the second surface S2 of the substrate 100, the depth of the second void 118 may be minimally at the interface between the substrate 100 and the nucleation layer 102, maximally below the two-dimensional electron gas 105 in the channel layer 106, and preferably to an extent within the buffer layer 104. That is to say, any configuration with the two-dimensional electron gas 105 located between the second void 118 and the barrier layer 108 falls in the scope of the invention. In an embodiment of the invention, the metal layer 124 is further disposed on the surface of the second void 118.

Figure 3:
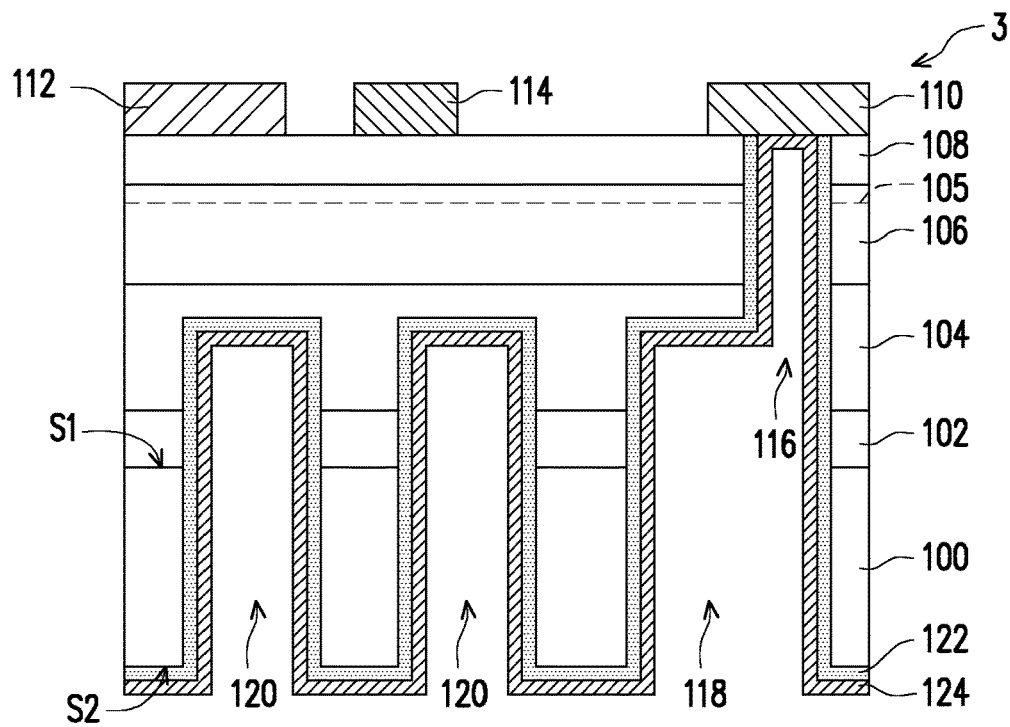
Figure 4:
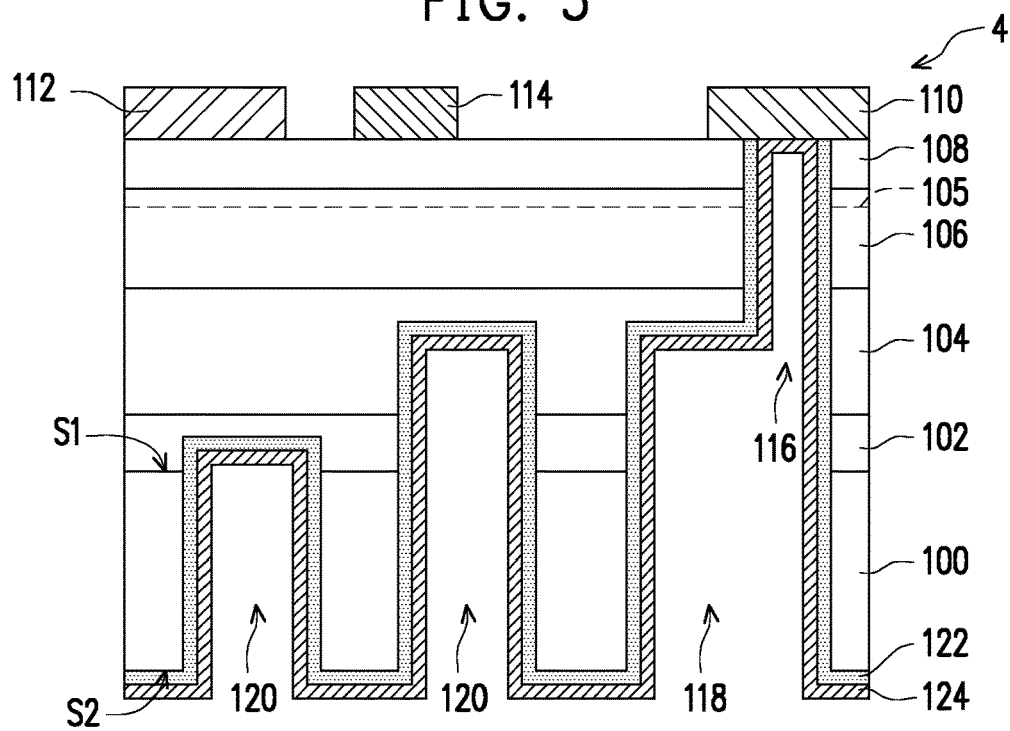
Figure 5:
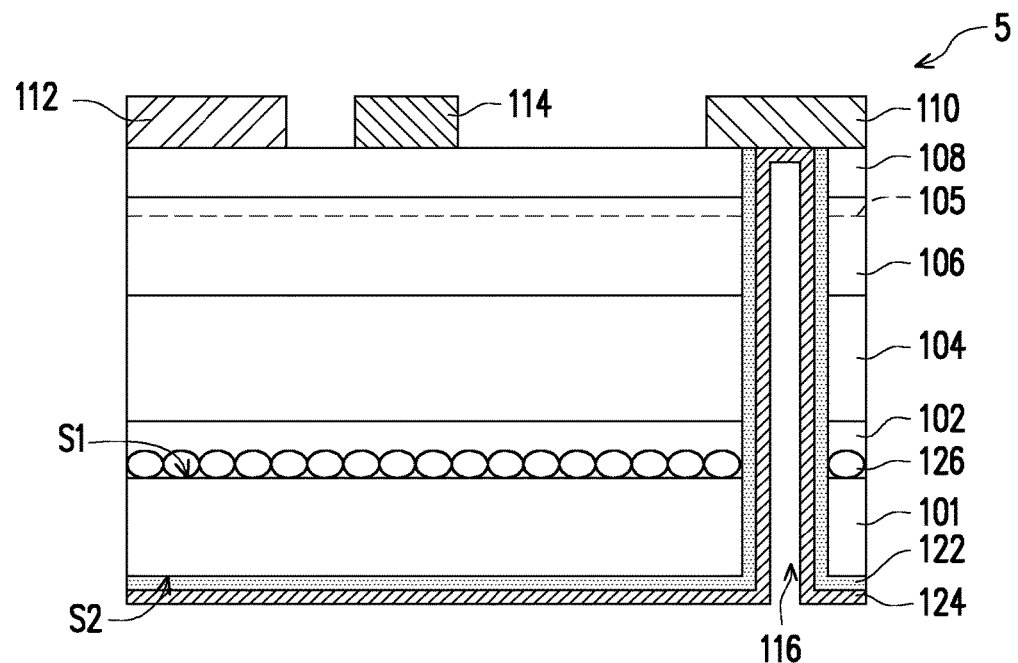
Figure 6:
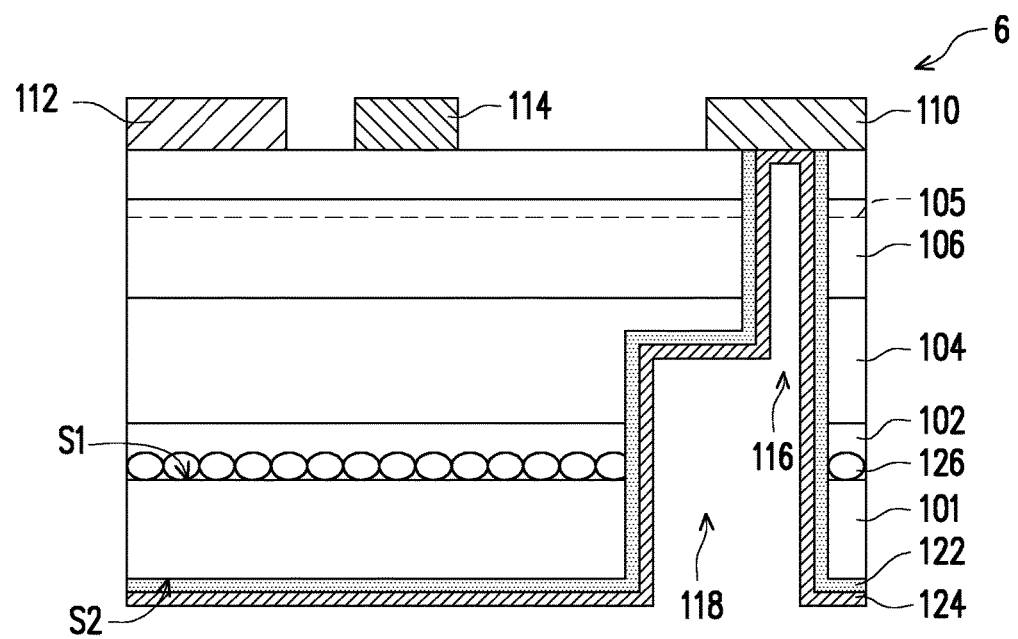
Figure 7:
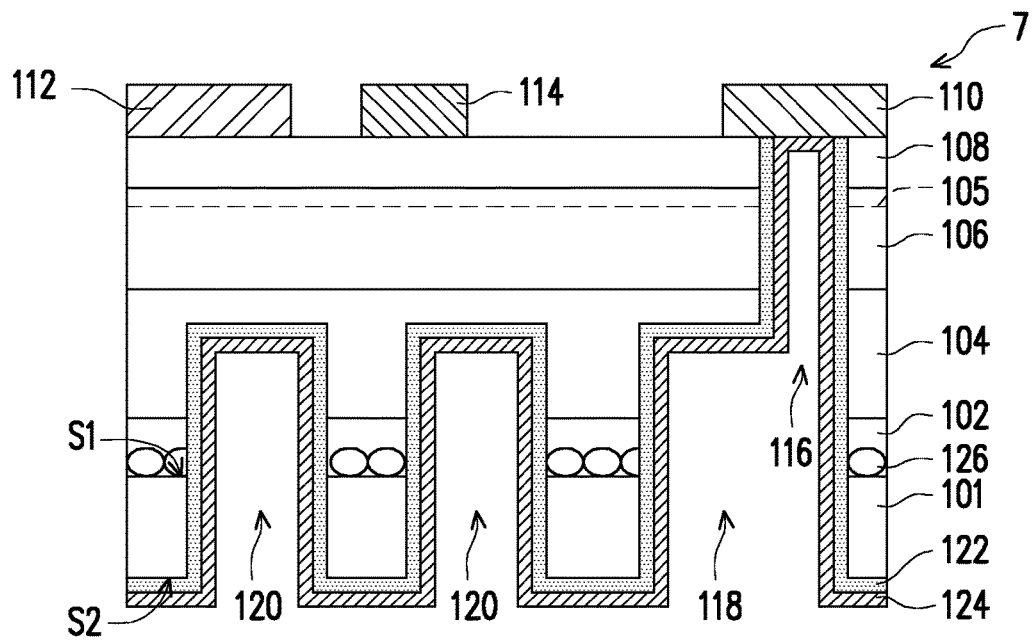
Figure 8:
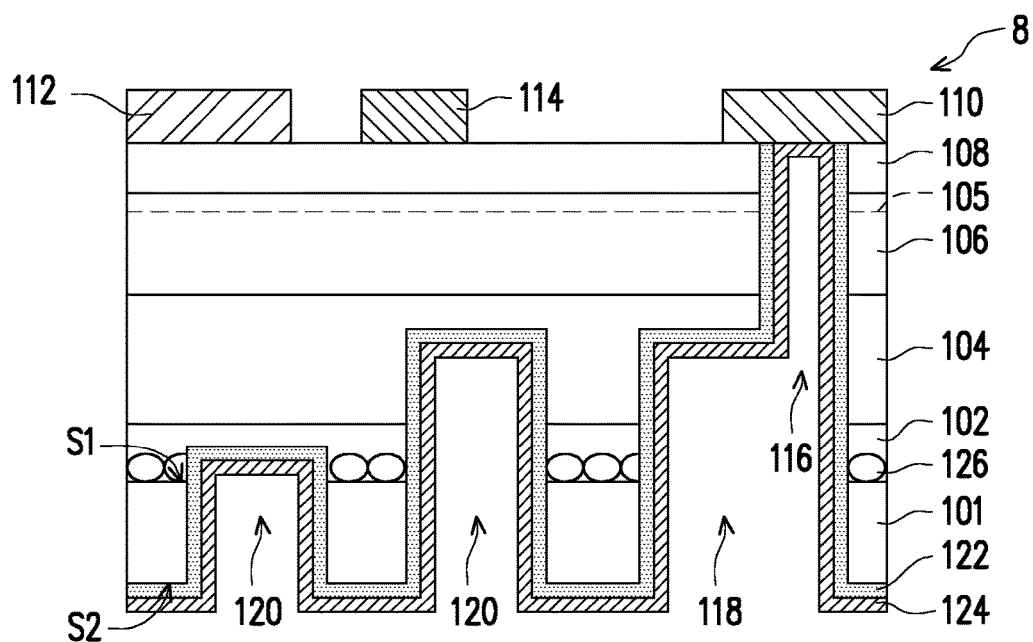
Figure 9:
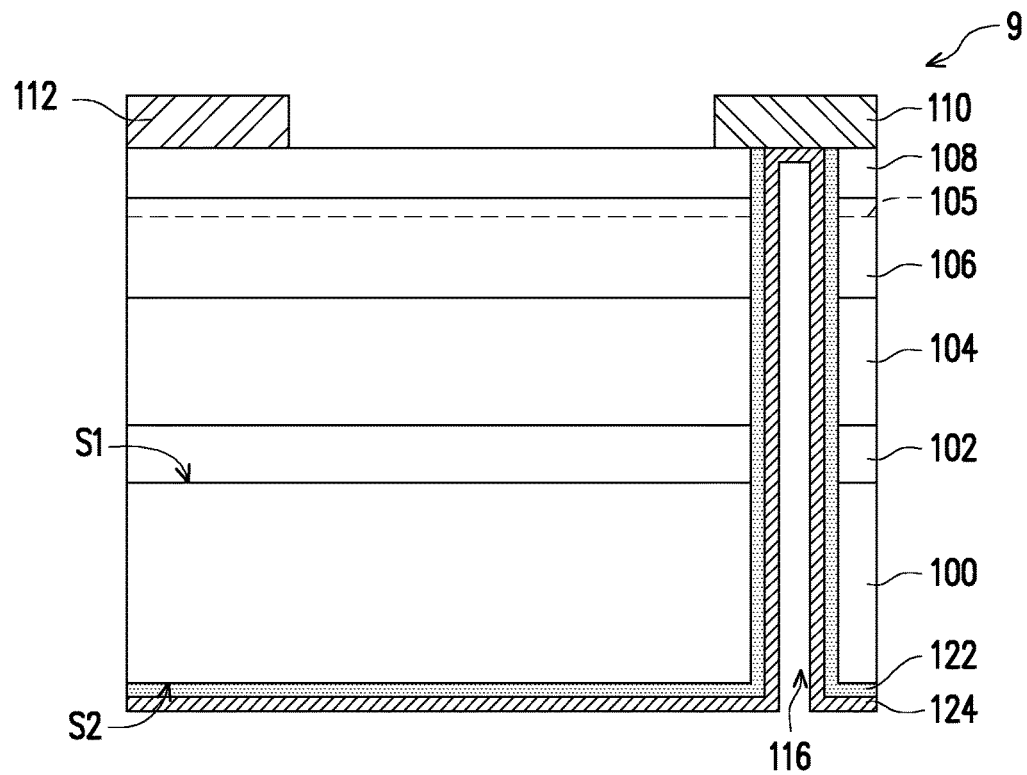
FIG. 9 to FIG. 16 are schematic cross-sectional views of a variety of nitride semiconductor devices according to alternative embodiments of the invention.
Figure 10:
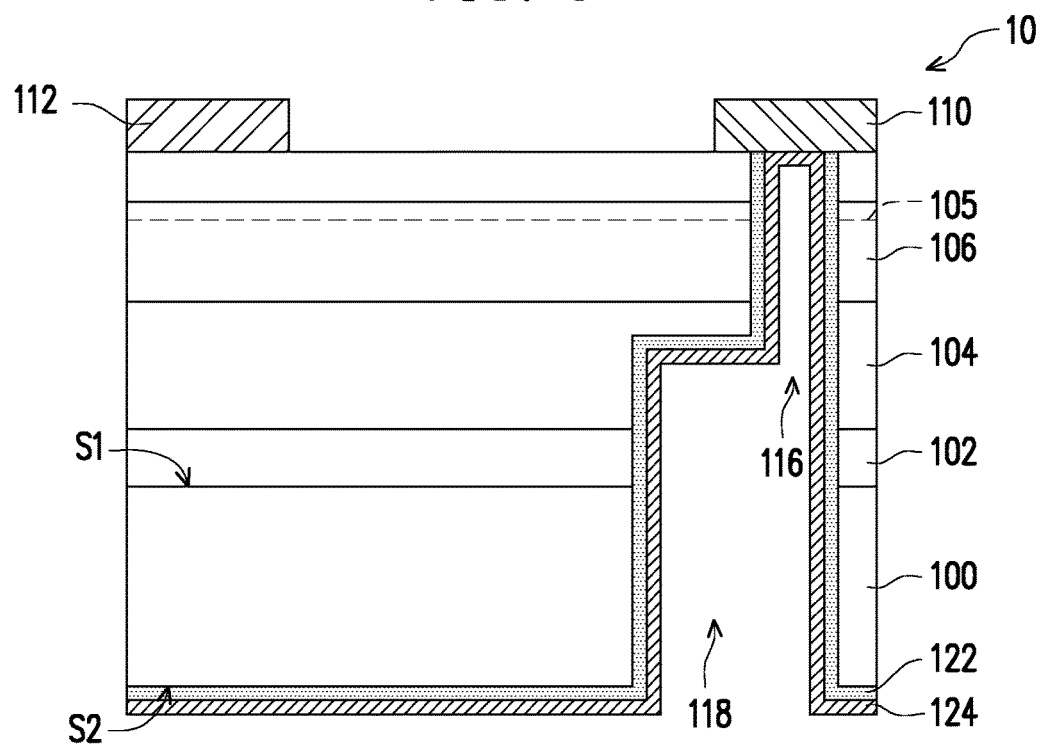
Figure 11:
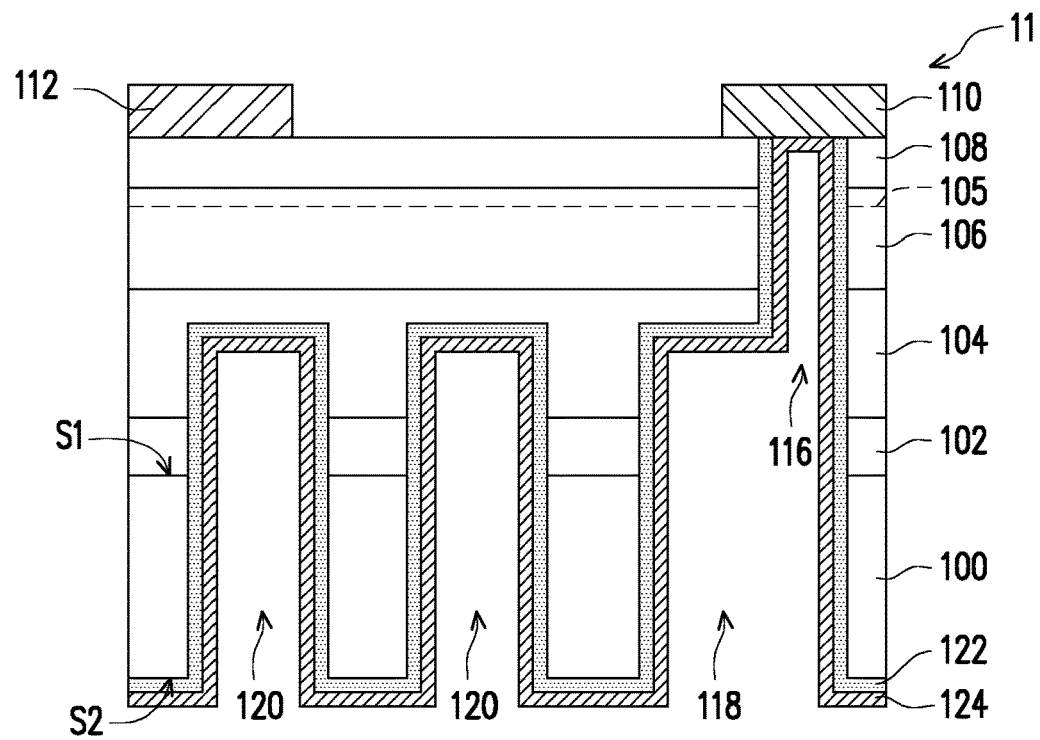
Figure 12:
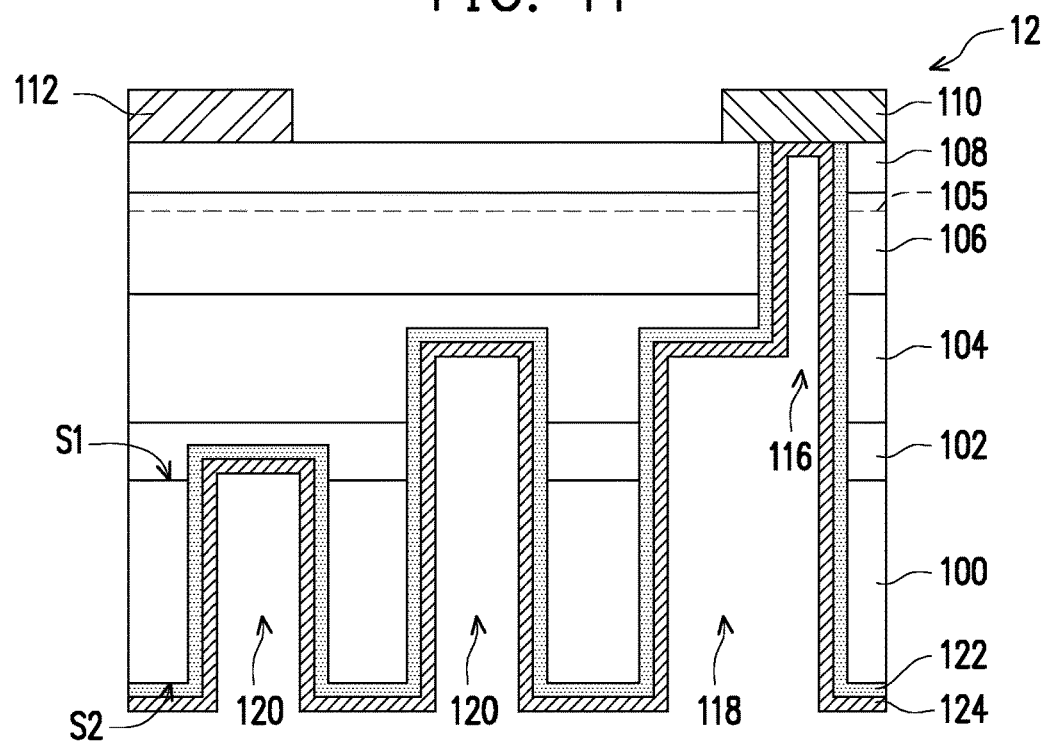
Figure 13:
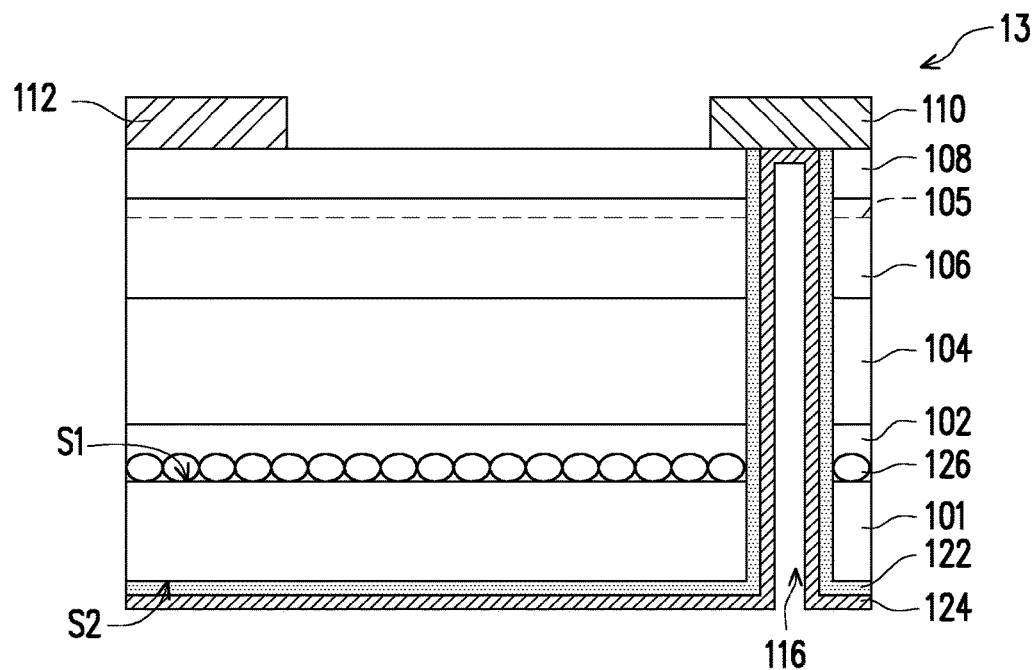
Figure 14:
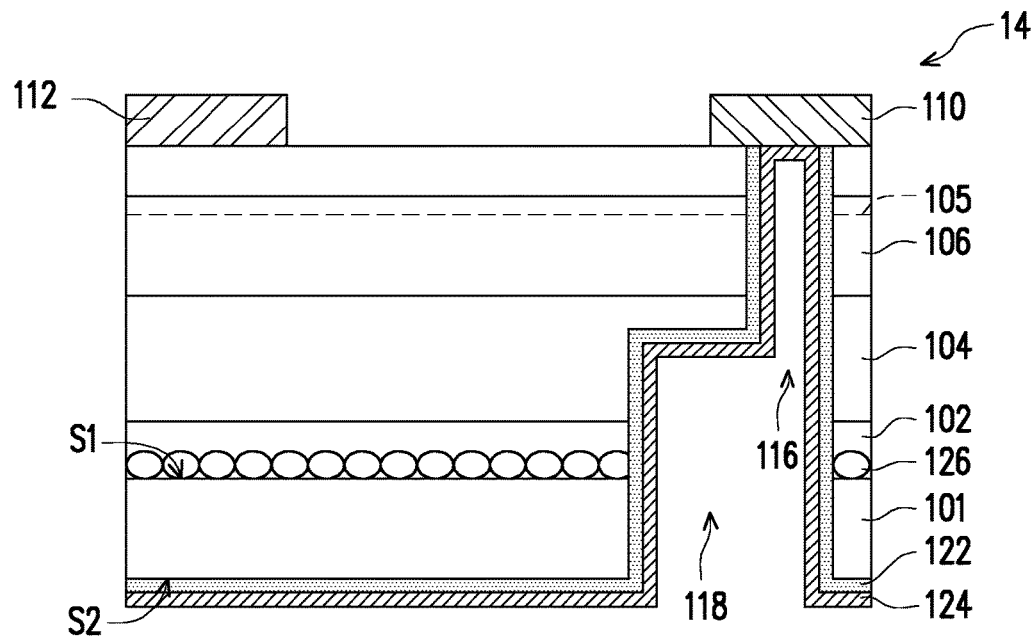
Figure 15:
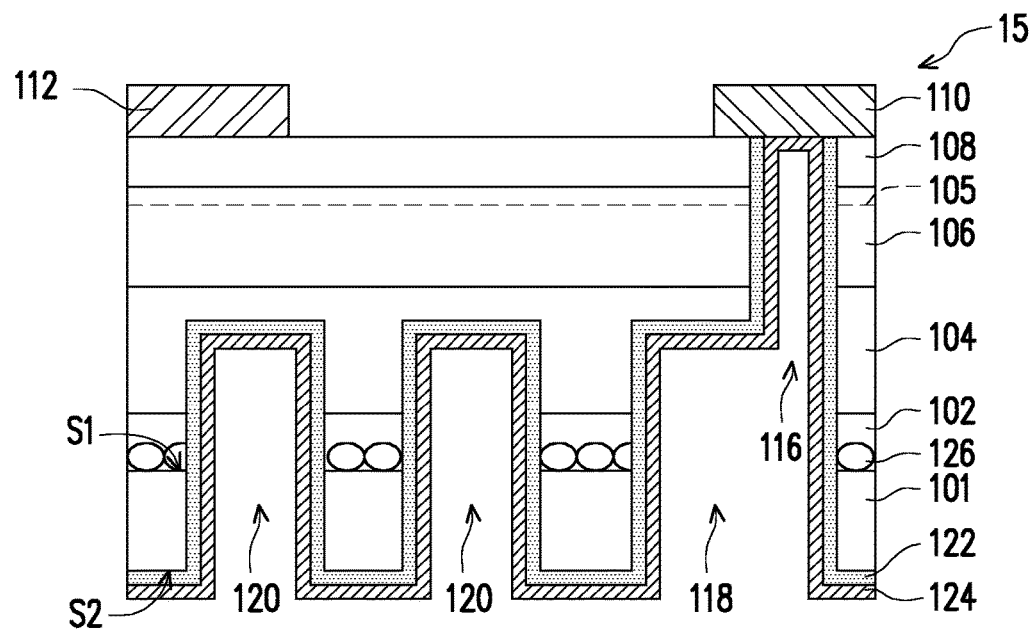
Figure 16:
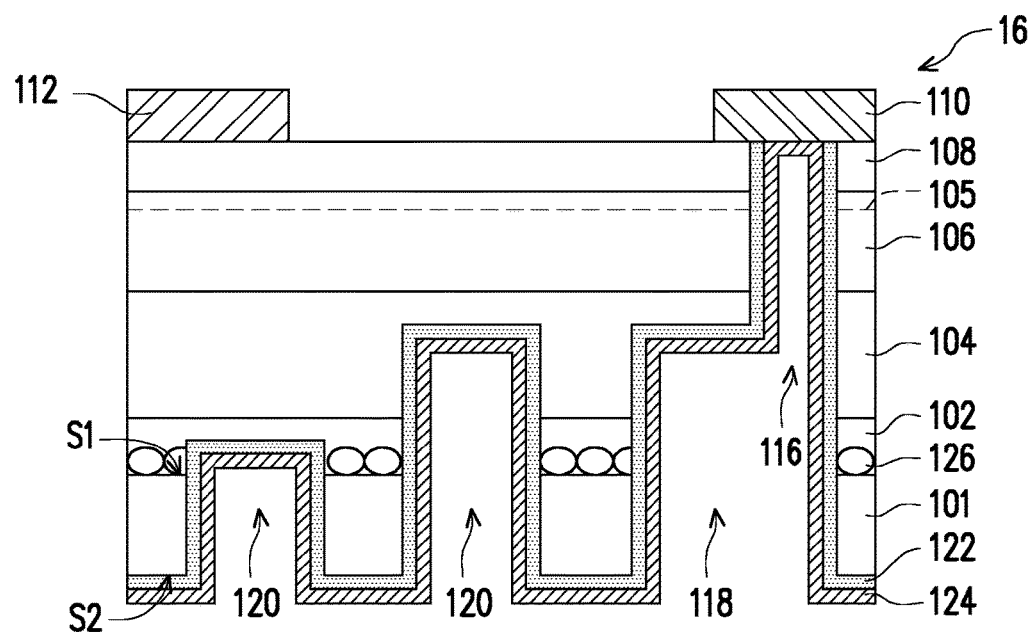

The nitride semiconductor devices 3 and 4 in FIG. 3 and FIG. 4 are similar to the nitride semiconductor device 2 in FIG. 2, and the difference between them lies in that, the back substrate structures of the nitride semiconductor devices 3 and 4 each further include one or more third voids 120. The third voids 120 penetrate through the substrate 100 and at least extend into the nucleation layer 102. The third voids 120 are separated from the second void 118. In an embodiment of the invention, when measuring from the second surface S2 of the substrate 100, the third voids 120 and the second void 118 have the same depth, as shown in FIG. 3. In another embodiment of the invention, when measuring from the second surface S2 of the substrate 100, at least one of the third voids 120 has a depth different from that of the second void 118, as shown in FIG. 4. Moreover, the third voids 120 may have a width same as or different from that of the second void 118.

The third voids 120 may have same or different sizes, wherein the size refers to width, depth, or both. In an embodiment of the invention, as shown in FIG. 3, the third voids 120 have the same width and depth. More specifically, all of the third voids 120 penetrate through the substrate 100 and the nucleation layer 102 and extend into the buffer layer 104. In another embodiment of the invention, as shown in FIG. 4, the third voids 120 have the same width but the depths thereof gradually reduce as distances to the second void 118 increase. More specifically, a third void 120 of the third voids 120 located adjacent to the second void 118 penetrates through the substrate 100 and the nucleation layer 102 and extends into the buffer layer 104, while another third void 120 of the third voids 120 located farther away from the second void 118 penetrates through the substrate 100 and extends into the nucleation layer 102.

In an embodiment of the invention, the metal layer 124 is further disposed on surfaces of the third voids 120. Thereby, the area of the back surface of the substrate 100 covered by metal is increased and the heat dissipation ability of the substrate is facilitated.

Nitride semiconductor devices 5, 6, 7, and 8 in FIG. 5 to FIG. 8 are similar to the nitride semiconductor devices 1, 2, 3, and 4 in FIG. 1 to FIG. 4, and the difference between them lies in that, the back substrate structures of the nitride semiconductor devices 5, 6, 7, and 8 each further include an insulation doped region 126. The insulation doped region 126 is a high-resistance region and is capable of effectively blocking a current leakage path. In an embodiment of the invention, the insulation doped region 126 is located between the substrate 101 and the channel layer 106 and is located aside one or more voids. More specifically, when measuring from the second surface S2 of the substrate 100, the insulation doped region 126 may be minimally located at a depth at the interface between the substrate 100 and the nucleation layer 102, maximally located at a depth at the interface between the buffer layer 104 and the channel layer 106, and preferably at a depth within the nucleation layer 102. In an embodiment of the invention, the dopant in the insulation doped region 126 includes neutral atoms such as argon, nitride, or a combination thereof.

It is noted that, in each of the nitride semiconductor devices 5, 6, 7, and 8, a thinning process to the substrate is required since a doping process to the back surfaces of the substrate is required to form the insulation doped region 126. In the nitride semiconductor devices 1, 2, 3, and 4, however, such thinning process to the substrate is not required. In other words, the substrate 101 of each of the nitride semiconductor devices 5, 6, 7, and 8 is thinner, while the substrate 100 of each of the nitride semiconductor devices 1, 2, 3, and 4 is thicker. In an embodiment of the invention, the thickness ratio of the thinner substrate 101 to the nucleation layer 102 falls in a range from about 3:1 to 10:1, such as from about 5:1 to 6:1. In an embodiment of the invention, the thickness ratio of the thicker substrate 100 to the nucleation layer 102 falls in a range from 50:1 to 100:1, such as from 60:1 to 80:1.

In the aforementioned embodiments, a nitride semiconductor device being a field-effect transistor having a source, a drain, and a gate is taken as an example but the invention is not limited thereto. It is appreciated by people having ordinary skill in the art that the back substrate structure according to the embodiments of the invention is also applicable in other lateral electronic devices, such as a Schottky diode.

Nitride semiconductor devices 9, 10, 11, 12, 13, 14, 15, and 16 in FIG. 9 to FIG. 16 are similar to the nitride semiconductor devices 1, 2, 3, 4, 5, 6, 7, and 8 in FIG. 1 to FIG. 8, and the difference between them lies in that, the nitride semiconductor devices 9, 10, 11, 12, 13, 14, 15, and 16 are applied in Schottky diodes, while the nitride semiconductor devices 1, 2, 3, 4, 5, 6, 7, and 8 are applied in field-effect transistors. In the embodiments of FIG. 9 to FIG. 16, the first electrode 110 is an anode and the second electrode 112 is a cathode. In an embodiment of the invention, the first electrode 110 includes a material able to form a Schottky contact with a Group III-V compound semiconductor. In another embodiment of the invention, the second electrode 112 includes a material able to form an Ohmic contact with a Group III-V compound semiconductor.

In conclusion of the above, according to the embodiments of the invention, the back substrate structure including at least one void (e.g., a first void and an optional second void) and a metal layer is introduced to a nitride semiconductor device, so as to increase the breakdown voltage and reduce current collapse. In an embodiment, first and second voids are disposed in the back surface of the substrate and the metal layer is disposed on the surfaces of the first and second voids, so as to electrically connect the substrate and the drain (or the anode). With such configuration, a low electric field may be formed between the device surface and the substrate to significantly reduce the chance of electrons being captured by defects internally and consequently reduce current collapse. Moreover, a dielectric layer disposed between the metal layer and each of the substrate, the nucleation layer, the buffer layer, the channel layer and the barrier layer is capable of blocking the current leakage path and increasing the breakdown voltage. Additionally, the design of the insulation doped area is capable of further blocking the current leakage path. The third void disposed in the back surface of the substrate is capable of further increasing the heat conduction ability of the substrate and lowering the operation temperature of the device.

It will be apparent to those skilled in the art that various modifications and variations can be made to the disclosed embodiments without departing from the scope or spirit of this invention. In view of the foregoing, it is intended that the invention covers modifications and variations provided that they fall within the scope of the following claims and their equivalents.

What is claimed is:
1. A nitride semiconductor device, comprising:
a substrate having a first surface and a second surface, the second surface being opposite to the first surface;
a nucleation layer, a buffer layer, a channel layer, and a barrier layer sequentially disposed on the first surface of the substrate; and
a first electrode and a second electrode disposed on the barrier layer, wherein a first void penetrates through the substrate, the nucleation layer, the buffer layer, the channel layer, and the barrier layer and exposes a portion of the first electrode,
wherein the nitride semiconductor device further comprises a metal layer disposed on the second surface of the substrate and a surface of the first void, and
wherein a second void penetrates through the substrate and the nucleation layer and extends into the buffer layer, the second void is connected to the first void, and the metal layer is further disposed on a surface of the second void.

2. The nitride semiconductor device of claim 1, wherein an edge of the second void exceeds an edge of the first electrode.

3. The nitride semiconductor device of claim 1, further comprising an insulation doped region located between the substrate and the channel layer.

4. The nitride semiconductor device of claim 1, wherein at least one third void penetrates through the substrate and at least extends into the nucleation layer, the at least one third void is separated from the second void, and the metal layer is further disposed on a surface of the at least one third void.

5. The nitride semiconductor device of claim 4, further comprising an insulation doped region located between the substrate and the channel layer.

6. The nitride semiconductor device of claim 4, wherein when measuring from the second surface of the substrate, the at least one third void and the second void have the same depth.

7. The nitride semiconductor device of claim 4, wherein when measuring from the second surface of the substrate, the at least one third void and the second void have different depths.

8. The nitride semiconductor device of claim 4, wherein the at least one third void includes a plurality of third voids having the same size.

9. The nitride semiconductor device of claim 4, wherein the at least one third void includes a plurality of third voids having respectively different sizes.

10. The nitride semiconductor device of claim 1, further comprising a dielectric layer disposed between the metal layer and each of the substrate, the nucleation layer, the buffer layer, the channel layer, and the barrier layer.

11. The nitride semiconductor device of claim 1, wherein a thickness ratio of the substrate to the nucleation layer falls in a range from 50:1 to 100:1.

12. The nitride semiconductor device of claim 1, further comprising a third electrode disposed on the barrier layer and between the first electrode and the second electrode.

13. The nitride semiconductor device of claim 12, wherein the first electrode is a drain, the second electrode is a source, and the third electrode is a gate.

14. The nitride semiconductor device of claim 1, wherein the first electrode is an anode and the second electrode is a cathode.

15. A nitride semiconductor device, comprising:
a substrate having a first surface and a second surface, the second surface being opposite to the first surface;
a nucleation layer, a buffer layer, a channel layer, and a barrier layer sequentially disposed on the first surface of the substrate; and
a first electrode and a second electrode disposed on the barrier layer, wherein a first void penetrates through the substrate, the nucleation layer, the buffer layer, the channel layer, and the barrier layer and exposes a portion of the first electrode, wherein the nitride semiconductor device further comprises an insulation doped region located between the substrate and the channel layer.

16. The nitride semiconductor device of claim 15, further comprising an insulation doped region located within the nucleation layer.

17. The nitride semiconductor device of claim 15, wherein a dopant in the insulation doped region comprises argon, nitride, or a combination thereof.

18. The nitride semiconductor device of claim 15, wherein a thickness ratio of the substrate to the nucleation layer falls in a range from 3:1 to 10:1.

* * * * *